(12) United States Patent
Aoki et al.

(10) Patent No.: US 6,551,945 B2
(45) Date of Patent: Apr. 22, 2003

(54) PROCESS FOR MANUFACTURING A SEMICONDUCTOR DEVICE

(75) Inventors: Hidemitsu Aoki, Tokyo (JP); Kaori Watanabe, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/791,220

(22) Filed: Feb. 23, 2001

(65) Prior Publication Data
US 2001/0024852 A1 Sep. 27, 2001

(30) Foreign Application Priority Data
Feb. 24, 2000 (JP) ........................... 2000-047443

(51) Int. Cl.[7] ............................................. H01L 21/302
(52) U.S. Cl. .................. 438/746; 438/748; 438/750; 438/627; 438/686
(58) Field of Search ................. 438/746, 747, 438/748, 749, 750, 751, 686, 627

(56) References Cited

U.S. PATENT DOCUMENTS

| | | | | |
|---|---|---|---|---|
| RE29,015 E | * | 10/1976 | De Angelo et al. | 427/54 |
| 4,430,152 A | * | 2/1984 | Okano | 156/643 |
| 4,973,379 A | * | 11/1990 | Brock et al. | 156/640 |
| 5,489,548 A | * | 2/1996 | Nishioka et al. | 437/60 |
| 5,746,930 A | * | 5/1998 | Belcher et al. | 216/87 |
| 6,049,021 A | * | 4/2000 | Getman et al. | 588/1 |
| 6,143,192 A | * | 11/2000 | Westmoreland | 216/101 |
| 6,143,705 A | * | 11/2000 | Kakizawa et al. | 510/175 |

FOREIGN PATENT DOCUMENTS

JP 09050981 A * 2/1997 ......... H01L/21/306

OTHER PUBLICATIONS

Nishioka et al. "Giga–bit Scale DRAM Cell with New Simple Ru/(Ba,Sr)TiO3/Ru Stacked Capacitors Using X–ray Lithography", IEDM 1995, pp. 903–906.*

* cited by examiner

Primary Examiner—Matthew Smith
Assistant Examiner—Renzo N. Rocchegiani
(74) Attorney, Agent, or Firm—Scully, Scott, Murphy & Presser

(57) ABSTRACT

A ruthenium containing metal 6' adhering to a periphery of a device forming area, an end face and a rear face in a silicon substrate 10 is removed using a first remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid. After the removing treatment, the substrate is washed with hydrofluoric acid to remove the residual remover.

57 Claims, 9 Drawing Sheets

(a)

(b)

(c)

(a)

(b)

(c)

PROCESS FOR MANUFACTURING A SEMICONDUCTOR DEVICE

BACKGROUND OF THE INVENTION

1. Field of the Invention

This invention relates to a process for manufacturing a semiconductor device comprising removal of an undesired ruthenium containing metal adhering to a semiconductor substrate.

2. Description of the Related Art

Recently, a high dielectric-constant film such as $Ta_2O_5$ has been used in place of a conventional silicon oxide or nitride film as a capacitance insulating film for a DRAM or FeRAM. Such a high dielectric-constant film permits us to ensure a required accumulated capacitance in a small occupied area and to improve a degree of memory-cell integration.

When using such a high dielectric-constant film and polysilicon as an electrode material sandwiching a capacitance film, oxygen is liberated from the high dielectric-constant film during heating a semiconductor device to oxidize the electrode material. There, therefore, exists a dielectric film (silicon oxide film) having a lower dielectric constant than the high dielectric-constant film between the electrode materials, leading to reduction in a capacitance. Thus, when using a high dielectric-constant film, it is important to select a material which does not become an insulating film due to oxidation as an electrode material sandwiching a capacitance film. It is because once a part of an electrode becomes an insulating film by oxidation, it constitutes a part of a capacitance film, resulting in a reduced capacitance. Ruthenium has recently attracted attention as an electrode material meeting the above requirement. Ruthenium is preferable because it retains conductivity even after oxidation, thus does not cause capacitance reduction and is inexpensive.

However, forming an electrode using ruthenium may lead to peeling of a ruthenium containing metal such as ruthenium and ruthenium oxide adhering to the end face or the rear face of a silicon substrate. The peeled metal may adhere to a device forming area or may cause cross contamination between devices or wafers via a carrying system. Recently, a procedure such as forming an electrode film within a narrow hole has been frequently employed for reducing an occupied area for a capacitor. It requires even forming of a thin ruthenium film, so that it is often essential to use CVD exhibiting good coverage as a deposition method, where adhesion of the ruthenium containing metal to the end and/or the rear faces of the silicon substrate becomes more prominent.

A ruthenium containing metal is known as a so-called lifetime killer to a semiconductor device. In particular, it may cause a variety of problems; for example, it adversely affects device operation due to reduction in carrier mobility and varying a threshold voltage of a transistor with time. A ruthenium containing metal is diffused at a higher rate in a silicon substrate than platinum also known as a lifetime killer. A trace amount of the ruthenium containing metal remaining on the silicon substrate surface may give prominent adverse affects on device properties. As described above, an undesired ruthenium containing metal remaining on a silicon substrate surface may deteriorate reliability of a device.

Therefore, when using ruthenium as an electrode material, it is important to remove an undesired ruthenium containing metal by treatment with an etchant. There have been, however, no etchants capable of dissolving and removing a ruthenium containing metal. For example, aqua regia used for forming a platinum electrode may not be used as a remover for a ruthenium containing metal due to its insufficient dissolving ability.

For effectively removing a ruthenium containing metal, a remover for ruthenium must not only dissolve the ruthenium containing metal but also effectively preventing the dissolved ruthenium containing metal from re-adhering to a silicon substrate.

SUMMARY OF THE INVENTION

In the light of the above situation, an objective of this invention is to provide a process for manufacturing a semiconductor device comprising depositing a ruthenium film wherein an undesired ruthenium containing metal may be adequately dissolved and removed and re-adhesion of the dissolved ruthenium containing metal may be effectively prevented.

To solve the above problems, this invention provides

[1] a process for manufacturing a semiconductor device, comprising the steps of:

depositing an insulating film in a device forming area on a semiconductor device;

depositing a barrier metal film on the insulating film;

depositing a first ruthenium film on the barrier metal film;

removing a ruthenium containing metal adhering to an area other than the device forming area using a first remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid;

removing the residual first remover using a first washing, sequentially depositing a capacitance insulating film and a second ruthenium film after patterning the first ruthenium film, removing a ruthenium containing metal adhering to an area other than the device forming area using a second remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid; and removing the residual second remover using a second washing;

[2] a process for manufacturing a semiconductor device, comprising the steps of:

depositing an insulating film in a device forming area on a semiconductor substrate, depositing a barrier metal film on the insulating film;

depositing a first ruthenium film on the barrier metal film;

removing a ruthenium containing metal adhering to an area other than the device forming area using a first remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid;

sequentially depositing a capacitance insulating film and a second ruthenium film after patterning the first ruthenium film, removing a ruthenium containing metal adhering to an area other than the device forming area using a second remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid; and removing the residual second remover using a second washing;

[3] a process for manufacturing a semiconductor device, comprising the steps of:

depositing an insulating film in a device forming area on a semiconductor substrate, depositing a barrier metal film on the insulating film;

depositing a first ruthenium film on the barrier metal film;

sequentially depositing a capacitance insulating film and a second ruthenium film after patterning the first ruthenium film, removing a ruthenium containing metal adhering to an area other than the device forming area using a second remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid; and removing the residual second remover using a second washing;

[4] a process for manufacturing a semiconductor device comprising the step of sequentially forming a lower electrode film, a capacitance insulating film and an upper electrode film in a device forming area on a semiconductor substrate, wherein the lower and/or the upper electrode films are made of ruthenium and comprising the steps of after deposing the ruthenium films, removing a ruthenium containing metal adhering to an area other than the device forming area using a second remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid; and then removing the residual remover using a washing;

[5] a process for manufacturing a semiconductor device comprising the steps of:

depositing a ruthenium film in a device forming area on a semiconductor substrate, and spraying on a given area on the semiconductor substrate a remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid while rotating the substantially horizontal semiconductor substrate to remove a ruthenium containing metal adhering to an area other than the device forming area.

According to the manufacturing process of this invention, a remover containing the above (a) and (b) components is used so that a ruthenium containing metal can be adequately dissolved and removed and can effectively prevent re-adhesion of the removed ruthenium containing metal.

In the manufacturing process for a semiconductor device of this invention, the remover is used for washing a semiconductor substrate. Unlike using such a liquid in wet etching, a particularly high level of technique is needed for preventing re-adhesion of the removed ruthenium containing metal. According to this invention to solve the problem, synergism in the combination of components (a) and (b) in the remover may realize satisfactory removal of a ruthenium containing metal and high level of prevention of re-adhesion, resulting in adequate washing. The term "an area other than a device forming area" includes end and rear faces of a semiconductor substrate and also peripheral areas in the device forming area (see FIG. 1).

A remover used in this invention is made of inexpensive materials and requires a lower etching cost. Furthermore, a technique such as spin washing may be employed to achieve adequate removing performance, resulting in a longer life of the etchant.

The above manufacturing processes [1] to [4] for a semiconductor device comprises, as one characteristic, the step of removing a residual remover using a washing after treatment with a remover. When using the remover having the particular composition, a cerium (IV) nitrate salt may precipitate after removal. In the manufacturing process for a semiconductor device, a washing is used for removing the residual remover. It may effectively prevent cross contamination between devices or wafers due to residual cerium (IV) nitrate to further improve device reliability. It is preferable to use a liquid containing hydrofluoric acid as a washing because it may effectively dissolve and remove the precipitated cerium (IV) nitrate salt and may prevent re-adhesion of the removed cerium (IV) nitrate salt. Examples of a liquid containing hydrofluoric acid include an aqueous solution of hydrofluoric acid and an aqueous solution of nitric acid and hydrofluoric acid. A concentration of hydrofluoric acid may be, for example, 0.1 wt % to 60 wt % both inclusive.

The manufacturing processes [1] to [4] for a semiconductor device form a capacitor on a semiconductor substrate and may be suitably applied to preparation of a DRAM or FeRAM. In general, a manufacturing process for a DRAM or FeRAM requires a higher level of contamination prevention compared with other semiconductor devices. A trace amount of a ruthenium containing metal may be diffused in a silicon substrate, leading to various problems such as deteriorated reliability in operation of a transistor. This invention may achieve a quite high level of contamination prevention (a residual ruthenium level of $10^9$ atoms/cm$^2$) and thus may be particularly suitable for a manufacturing process for a DRAM or FeRAM comprising forming a capacitor.

The manufacturing process [5] for a semiconductor device employs so-called spin washing technique in which a remover is sprayed on a semiconductor substrate while rotating the substantially horizontal substrate. When removing a ruthenium containing metal by spin washing, removal performance of the ruthenium containing metal may be remarkably improved (described later in Examples). Furthermore, temperature dependency of removing performance may be reduced to adequately remove the ruthenium containing metal even at room temperature. Thus, it may eliminates heating an etchant to simplify an ancillary equipment for washing and to increase a life of the etchant.

In the manufacturing process [5] for a semiconductor device, after forming a lower electrode film and before forming a capacitance insulating film, a ruthenium containing metal adhering to an area other than a device forming area on a semiconductor substrate may be removed using a second remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid. It may more effectively prevent contamination by the ruthenium containing metal.

In a manufacturing process for a semiconductor device of this invention, when removing a residual second remover using a second washing after removing a ruthenium containing metal with the second remover, the residual cerium (IV) nitrate salt can be removed and additionally an undesired capacitance insulating film adhering to a rear and an end faces of the semiconductor substrate may be simultaneously removed by appropriately selecting the type of the second washing. It may eliminate a step for removing an undesired capacitance insulating film, leading to improvement in productivity. For example, $Ta_2O_5$ as a material for a capacitance insulating film and an aqueous solution of hydrofluoric acid as a second washing may be used to simultaneously remove both residual cerium (IV) nitrate salt and $Ta_2O_5$. FIG. 7 shows an etching rate for a $Ta_2O_5$ film when immersing a silicon substrate having the $Ta_2O_5$ film in an aqueous solution of hydrofluoric acid and indicates that as the acid concentration increases, $Ta_2O_5$ may be more suitably dissolved.

A washing for removing a residual remover may be a liquid containing hydrofluoric acid; specifically, an aqueous solution of hydrofluoric acid and an aqueous solution of nitric acid and hydrofluoric acid. A concentration of hydrofluoric acid may be, for example, 0.1 wt % to 60 wt % both inclusive. For simultaneously removing a capacitance insulating film such as $Ta_2O_5$ as described above, the content of hydrofluoric acid is preferably 20 wt % or more, more preferably 30 wt % or more, most preferably 40 wt % or more.

As described above, a process for manufacturing a semiconductor device of this invention has a characteristic of using a remover containing a cerium (IV) nitrate salt and an acid.

For a composition in which a cerium (IV) nitrate salt and an acid is combined, JP-B 7-7757 and JP-A 11-131263 have described that used as an etchant for preparing a chrome mask used in a lithography process. When preparing the chrome mask, it is necessary to etch a chromium film such that its cross section becomes tapered. It is known that such a taper shape may be suitably formed by conducting wet etching using a composition having the above combination after forming a resist mask on a chromium film because chromium is dissolved by the action of a cerium (IV) nitrate salt while nitric acid peels the resist mask and the chromium film.

These publications have, however, described etching chromium and there are no description for action to a ruthenium containing metal.

JP-A 11-84627 has disclosed a technique for patterning a chromium film and described that ruthenium may be used in place of a chromium film. It has, however, described only dry etching for etching using ruthenium and there are no descriptions for wet-etching ruthenium using an etchant.

As described above, it has been unknown that a combination of a cerium (IV) nitrate salt and a particular acid exhibits excellent performance in removing a ruthenium containing metal and may effectively prevent re-adhesion of the removed ruthenium containing metal. This invention is based on the observation.

DETAILED DESCRIPTION OF THE PREFERRED EMBODIMENTS

Figure 1:
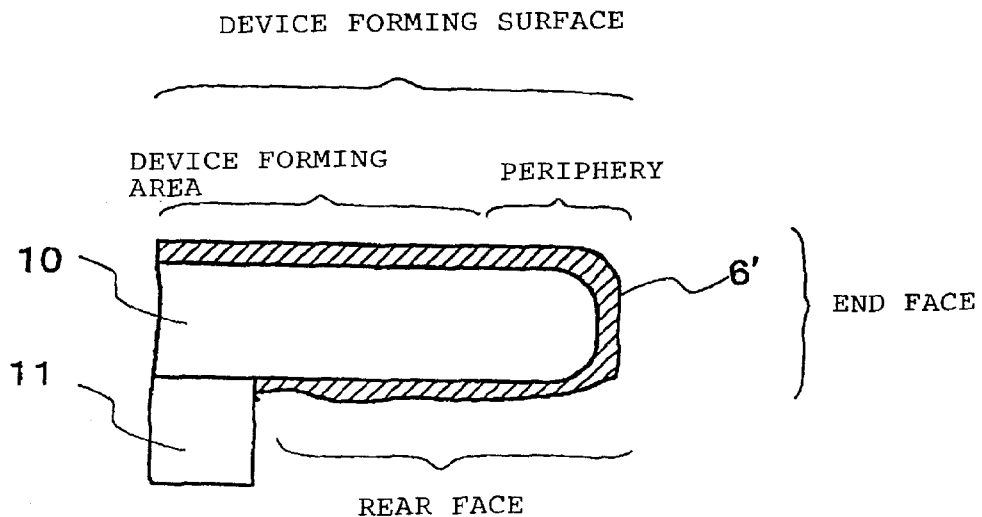
FIG. 1 shows an appearance of a silicon substrate after depositing an upper electrode.
Figure 2:
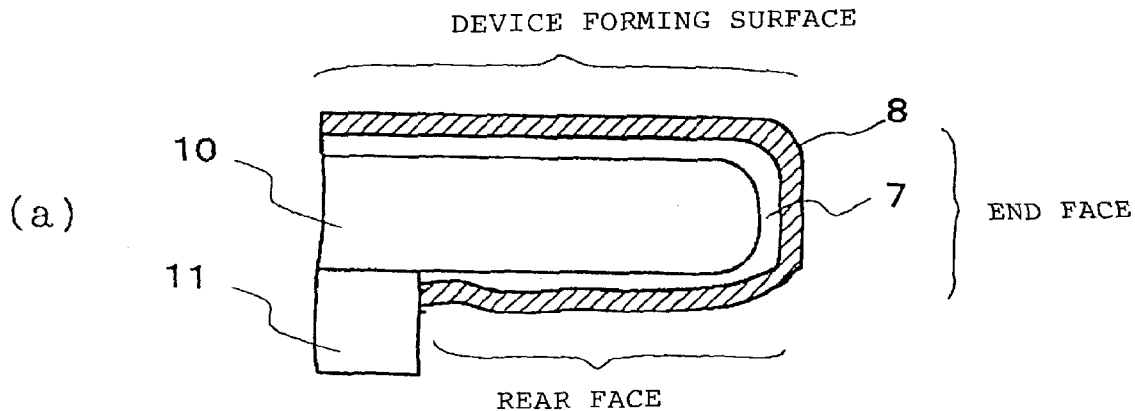
FIG. 2 shows an appearance of a silicon substrate after depositing a lower electrode.
Figure 2:
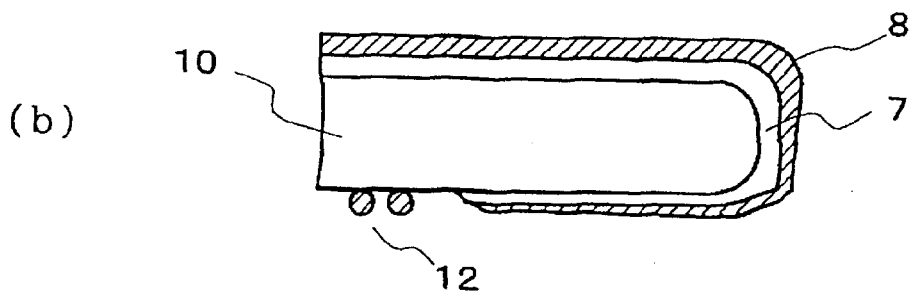
Figure 3:
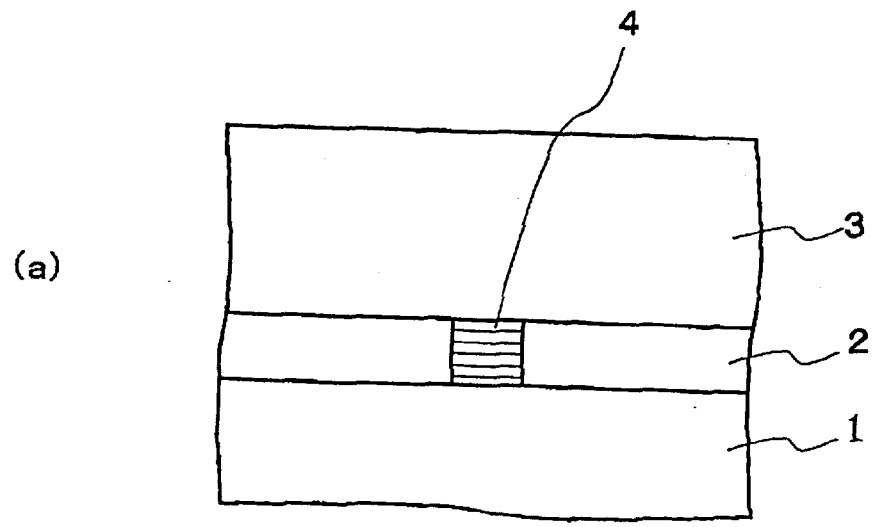
FIG. 3 is a process cross section illustrating an application of this invention to a process for manufacturing a capacitor.
Figure 3:
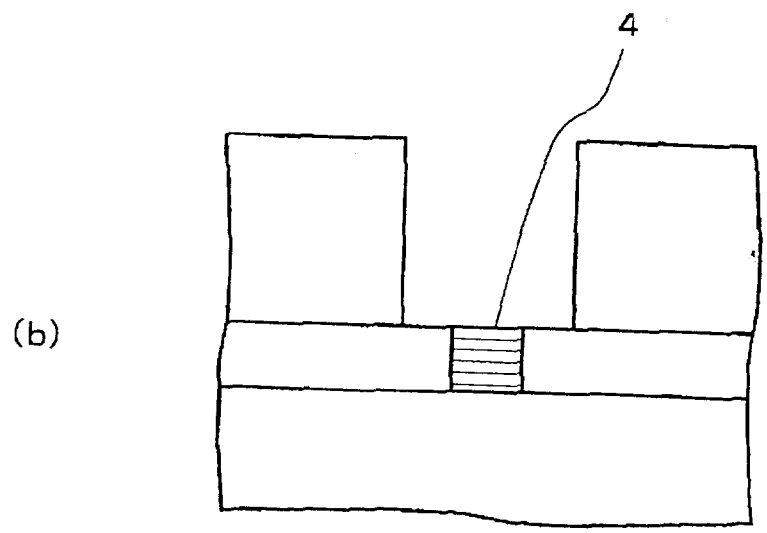
Figure 3:
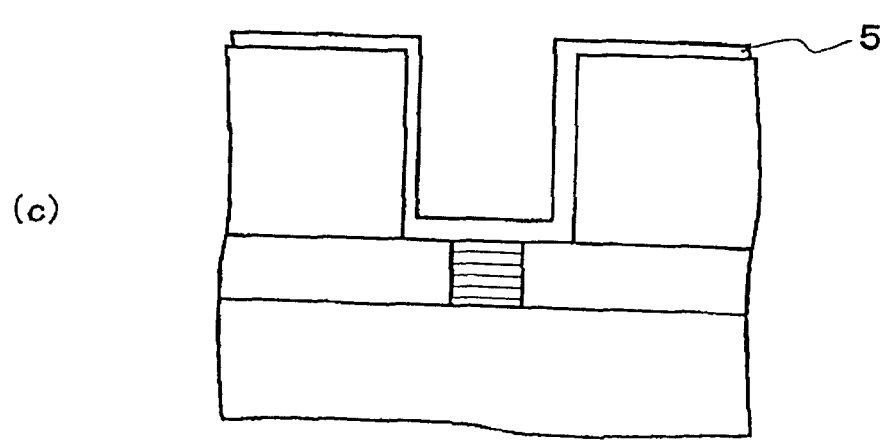
Figure 4:
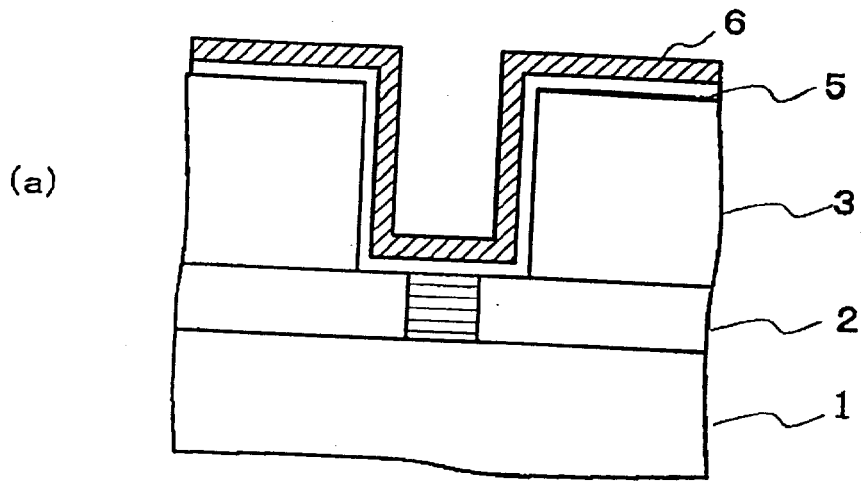
FIG. 4 is a process cross section illustrating another application of this invention to a process for manufacturing a capacitor.
Figure 4:
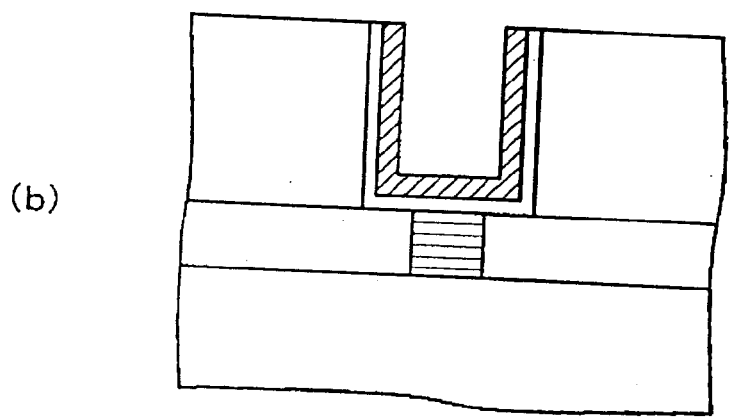
Figure 4:
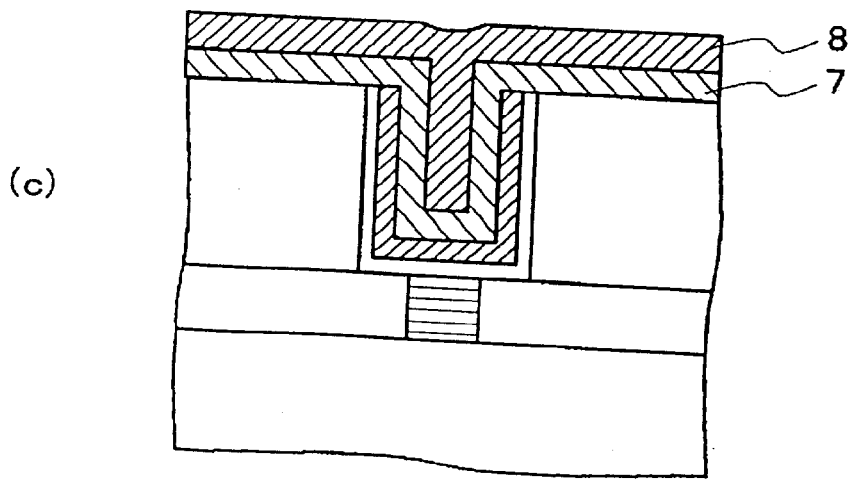

Component (a) in this invention is at least one compound selected from the group consisting of salts containing chlorate, perchlorate, iodate, periodate, salts containing bromine oxide ion; salts containing manganese oxide ion; and salts containing cerium (IV) ion. Acids containing chlorate ion ($ClO_3^-$) include chloric acid and perchloric acid. Acids containing iodate ion ($IO_4^-$) include iodic acid and periodic acid. Salts containing bromine oxide ion include bromine oxide and bromoacetic acid. Salts containing manganese oxide ion include manganese oxide and manganese dioxide. Salts containing cerium (IV) ion include a cerium (IV) nitrate salt.

Among the above compounds, salts containing cerium (IV) ion is preferable as component (a). In particular, a cerium (IV) nitrate salt is preferably used. It may effectively dissolve not only ruthenium but also ruthenium oxide and effectively remove a ruthenium containing metal adhering to a substrate after depositing ruthenium. Furthermore, it may exhibit adequate effect for removing a ruthenium containing metal even at a low temperature of about 30° C., which may eliminate heating of an etchant, simplify an equipment for removal and elongate an etchant life. Additionally, precipitation of cerium after removal may be reduced to a relatively small amount, so that adequate cleanliness of the substrate surface may be ensured after subsequent washing.

On the other hand, when using periodic acid as component (a), it may exhibit insufficient dissolving performance to ruthenium oxide. It may be, therefore, difficult to effectively remove a ruthenium containing metal attached to a substrate and may lead to a higher etchant cost compared with a cerium (IV) nitrate salt and a higher etching cost.

Examples of a cerium (IV) nitrate salt include cerium (IV) ammonium nitrate and cerium (IV) potassium nitrate. Cerium (IV) ammonium nitrate is preferable because it less influences device performance.

Component (b) in this invention is at least one acid selected from the group consisting of nitric acid, acetic acid, iodic acid and chloric acid. It is preferably nitric acid or acetic acid, most preferably nitric acid. Such an acid may be selected to realize synergism with component (a), resulting in prominent effect for removing a ruthenium containing metal.

In this invention, the content of component (a) is preferably 5 wt % or more, more preferably 10 wt % or more, for adequately dissolving and removing a ruthenium containing metal and preventing re-adhesion of the removed ruthenium containing metal. The upper limit of the content is preferably 30 wt % or less, more preferably 25 wt % or less, for effectively preventing precipitation of compound (a).

In this invention, the content of component (b) is preferably 1 wt % or more, more preferably 5 wt % or more, for adequately dissolving and removing a ruthenium containing metal and preventing re-adhesion of the removed ruthenium containing metal. There are no particular restrictions to an upper limit of the content, but it may be, for example, 30 wt % or less.

A remover in this invention exhibits higher performance for removing a ruthenium containing metal and for re-adhesion prevention by means of synergism provided by a combination of the above components (a) and (b). It is difficult to adequately remove a ruthenium containing metal with component (a) or (b) alone.

Besides the above components (a) and (b), a remover in this invention preferably contains water as component (c), which may enhance performance of the components (a) and (b) for removing a ruthenium containing metal.

The remover may contain, instead of or in addition to component (c), a water-soluble organic solvent, which may be miscible with water and other components in this invention.

A remover in this invention may contain other components such as a surfactant.

A preferable embodiment of a remover in this invention may be one consisting of the above (a), (b) or (c) alone or that to which a small amount of, for example, additive is added.

A remover in this invention may be repeatedly used because it is resistant to etchant fatigue. For example, when the remover is applied to spin washing, a remover sprayed on a substrate may be recovered to be re-used in treatment of another substrate. When a ruthenium film is deposited on the substrate surface, an undesired ruthenium containing metal adheres to the zonal area within 0.8 mm from the side of the substrate surface (periphery) and the rear face of the substrate. When applying the above technique where the recovered remover was reused while keeping the remover circulation system at 60° C. for removing these materials, 3000 sheets of silicon wafers could be treated. The area within 0.8 mm from the side of the substrate surface herein corresponds to the area where handler is in contact with carrier. Contamination of this area and the rear face of the substrate may be prevented to effectively prevent cross-contamination.

Examples of a semiconductor substrate in this invention include a silicon substrate as well as a semiconductor substrate of a group III-V compound such as GaAs, InP and GaN or a group II-VI compound such as ZnSe. This invention is particularly suitable to treatment of a silicon substrate because this invention exhibits good performance for removing a ruthenium containing metal and is thus prominently effective when being applied to a silicon substrate where deterioration in device performance due to diffusion of ruthenium in the substrate is significant.

In this invention, removal of a ruthenium containing metal using a remover is preferably conducted by a technique where a first remover is sprayed on a given area on a semiconductor substrate while rotating the semiconductor substrate which is kept substantially horizontal. It may significantly improve performance of removing the ruthenium containing metal, reduce temperature dependency of removal performance and allow the ruthenium containing metal to be adequately removed even at room temperature. Thus, it may eliminate heating of an etchant, simplify an equipment for washing and increase an etchant life.

When removing a ruthenium containing metal using a remover in this invention, a gas or liquid may be introduced to a surface having a device forming area on a semiconductor substrate to prevent the remover from going around to the device forming area and thus to prevent damage to a ruthenium film formed in a device region.

Figure 10:
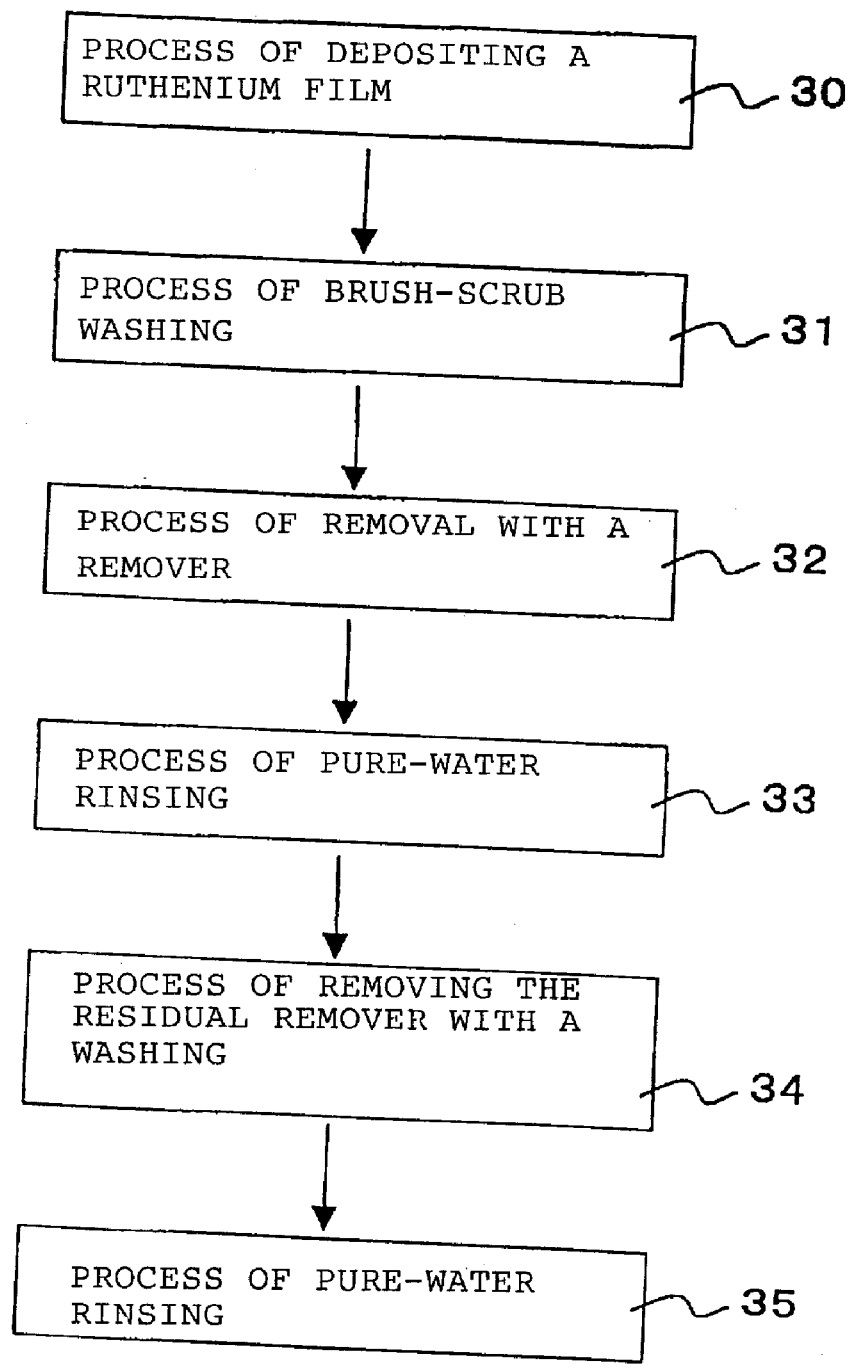
FIG. 10 shows an example of procedure for treatment after depositing a ruthenium film in this invention.
Figure 12:
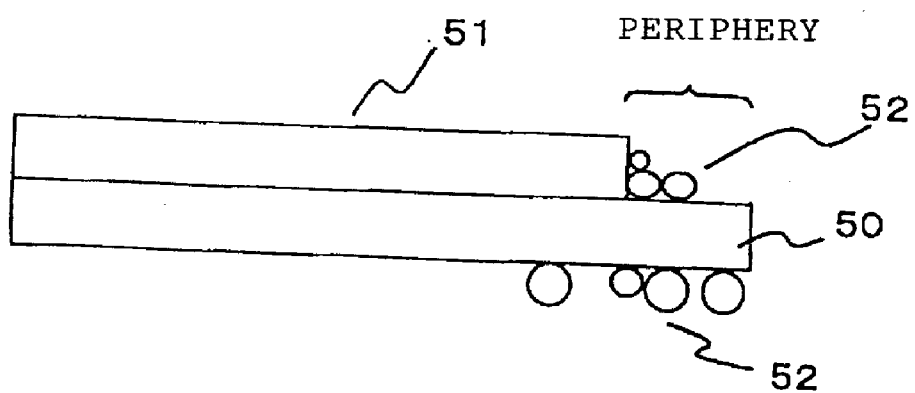
FIG. 12 illustrates a periphery of a semiconductor substrate after depositing a ruthenium film.

There will be described an example of a processing procedure after depositing a ruthenium film in this invention with reference to FIG. 10. a ruthenium film is deposited (step 30) by, for example, CVD. Then, brush-scrub washing (step 31) is conducted, whereby particulate contaminant such as ruthenium adheres to the rear face or the periphery of the surface (the device forming surface) of the semiconductor substrate 50 at the end of the step of depositing the ruthenium film (FIG. 12). Brush scrub washing can effectively remove the contaminant 52. In particular, brush scrub washing is effective to the contaminant 52 adhering to the edge of the ruthenium film 51 in the periphery on the device forming surface which is difficult to be removed.

Figure 11:
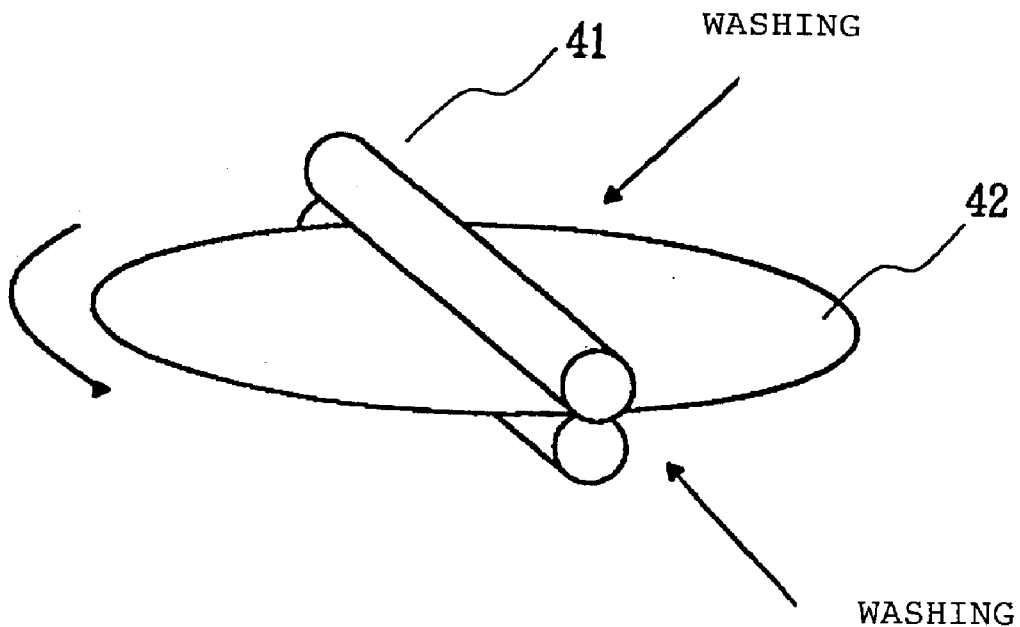
FIG. 11 illustrates brush scrub washing.

Brush scrub washing may be conducted by adding dropwise a washing to the front and the rear faces of the semiconductor substrate 42 sandwiched by a pair of brushes 41 while rotating the substrate 42 as shown in FIG. 11. The technique may employ, besides the roll type brush as illustrated in the figure, a disc type brush. The washing may be supplied by adding dropwise it on the brush, on a wafer near the brush, or inside of the brush.

The washing used in the step 31 of brush scrub washing may be pure water, aqueous ammonia, electrolytic cathode water or hydrogen-dissolving water, which may appropriately contain an additive such as a surfactant. Electrolytic cathode water herein refers to a liquid generated around a cathode during electrolysis of pure water or water containing a small amount of ammonium ion (0.5 wt % or less). An apparatus generally used for generating electrolytic cathode water is a dual-cell electrolysis type apparatus (see, for example, Denki Kagaku Binran 4th ed., p.277 (1985)).

Hydrogen-dissolving water herein refers to an aqueous solution where hydrogen is dissolved in pure water or water containing a small amount of ammonium ion (0.5 wt % or less). Hydrogen may be dissolved by, for example, bubbling.

After the step 31 of brush scrub washing, removal with a remover is conducted (step 32). The remover may be as described above; for example, a mixed solution of a cerium (IV) nitrate salt and an acid including nitric acid. This step may remove a ruthenium containing metal adhering to the periphery of the rear face or the front face (the device forming surface) of the semiconductor substrate. When initiating this removal step, particulate ruthenium has been removed in the previous step 31 of brush scrub washing. This removal step, therefore, removes an adhering ruthenium containing metal as a film. Thus, both particulate and film-type ruthenium containing metal may be effectively removed by combining the steps of brush scrub washing 31 and removal 32.

Then, pure-water rinsing is conducted (step 33). Specifically, the surface with the device forming area on the semiconductor substrate is washed by introducing water to the surface, whereby a precipitated cerium (IV) nitrate salt may be removed. This step is preferably conducted by spin washing in the light of a removal efficiency.

Then, the residual remover is removed with a washing (step 34). The washing used herein is preferably a solution containing hydrofluoric acid. This process may remove the residual washing including a cerium (IV) nitrate salt.

Then, pure-water rinsing is conducted (step 35). After treatment with the washing in the previous step, the cerium (IV) nitrate salt is dissolved in the washing. However, if there remains the washing containing the cerium (IV) nitrate salt, the cerium (IV) nitrate salt may precipitate after drying. It is, therefore, preferable to conduct pure-water rinsing, which may further improve cleanliness of the semiconductor substrate.

Then, the washing process is completed after drying the semiconductor substrate by, for example, nitrogen blow.

The process described above is a preferable example of the washing process and the steps of brush scrub washing 31 and pure-water rinsing 33, 35 may be omitted as appropriate.

There will be described a preferable embodiment of this invention for, as an example, a process for manufacturing a capacitor for a DRAM with reference to FIGS. 1 to 4. In this embodiment, a capacitor is formed, where a lower electrode film, a capacitance insulating film and an upper electrode film are deposited in a concave in an insulating film on a semiconductor substrate.

As shown in FIG. 3(a), on a silicon substrate 1 is formed an MOS transistor comprising a source-drain diffusion region (not shown) and then an interlayer insulating film 2 is formed over the whole surface of the silicon substrate 1. Then, on the unshown diffusion region is formed a contact plug 4. A filling material for the contact plug 4 may be polysilicon or tungsten. After forming the plug, the whole surface of the substrate is flattened and an interlayer insulating film 3 is formed on the surface.

Then, dry etching is conducted to form a hole reaching the contact plug 4 in the interlayer insulating film 3 (FIG. 3(b)). The cross section of the hole is preferably of ellipse having dimensions of, for example, a short axis of about 0.2 µm and a long axis of about 0.4 µm.

Then, a contact film 5 is formed over the whole surface of the substrate (FIG. 3(c)). The contact film 5 may be, for example, a film consisting of Ti and TiN deposited in sequence by an appropriate technique such as sputtering and CVD.

Then, over the whole surface of the substrate is formed a lower electrode film 6 made of ruthenium (FIG. 4(a)). Ruthenium may be used as an electrode material to effectively prevent capacitance reduction due to oxidation of the electrode material and to reduce a manufacturing cost. Ruthenium may be deposited by, for example, sputtering and CVD, preferably CVD because CVD is most suitable for forming a ruthenium film in a narrow hole shown in FIG. 4(a) with an even and satisfactory coverage. When employing CVD, a material gas may be, for example, bis (ethylcyclopentadienyl)ruthenium.

Then, the substrate is treated with a remover for removing a ruthenium containing metal adhering to an area other than the device forming area on the silicon substrate. When forming a lower electrode film 6 made of ruthenium by CVD, ruthenium 6' adheres to the end and the rear faces of the semiconductor substrate 10. The silicon substrate 10 illustrated in FIG. 10 corresponds to the state after the step of FIG. 4(b) where the films have been formed on the silicon substrate 1 in FIG. 4.

Ruthenium 6' is partly oxidized into ruthenium oxide. If feeding the semiconductor substrate 10 to which a ruthenium containing metal, comprising ruthenium oxide and the ruthenium containing metal 6', adheres to a carrying system, it may cause cross contamination of a deposition machine and may be apt to adversely affect device properties. For preventing such a problem, treatment with a remover is conducted in this embodiment.

The remover used contains (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid. The acid may be preferably at least one selected from the group consisting of nitric acid, perchloric acid and acetic acid. Such a remover may be used to effectively remove the ruthenium containing metal as described above and to effectively prevent re-adhesion of the removed ruthenium containing metal.

The remover is used for removing the ruthenium containing metal adhering to an area other than the device forming area. It is, therefore, desirable to prevent the remover from adhering to the device forming area during the removing procedure. Such a removing procedure will be described with reference to FIGS. 5 and 6.

Figure 5:
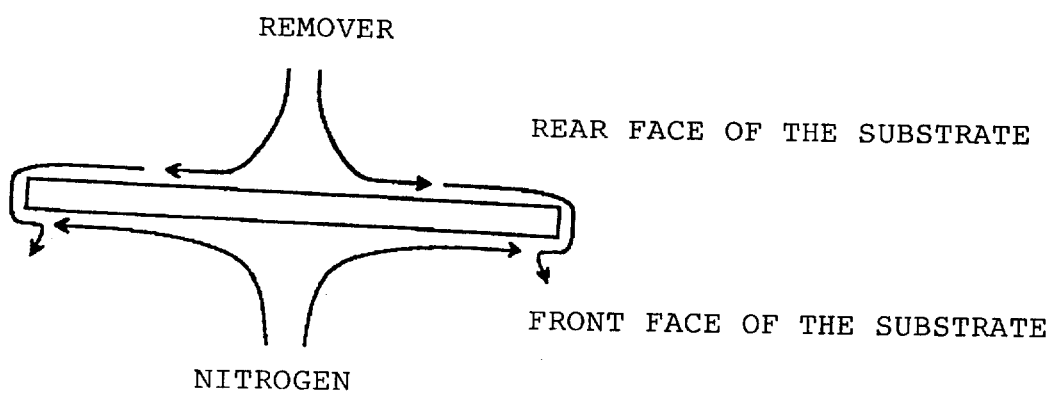
FIG. 5 shows a procedure for removing a ruthenium containing metal using a remover.

FIG. 5 shows an example of spin washing where a gas is introduced to the surface of the semiconductor substrate (the device forming surface) to prevent the remover from adhering to the device forming area. Rotating the silicon substrate 10, the remover is applied dropwise to the rear face of the substrate while introducing a gas such as nitrogen on the substrate surface. Introducing the gas prevents the remover from going around to the end face to protect the device forming surface. The gas may be an inert gas such as nitrogen.

Figure 6:
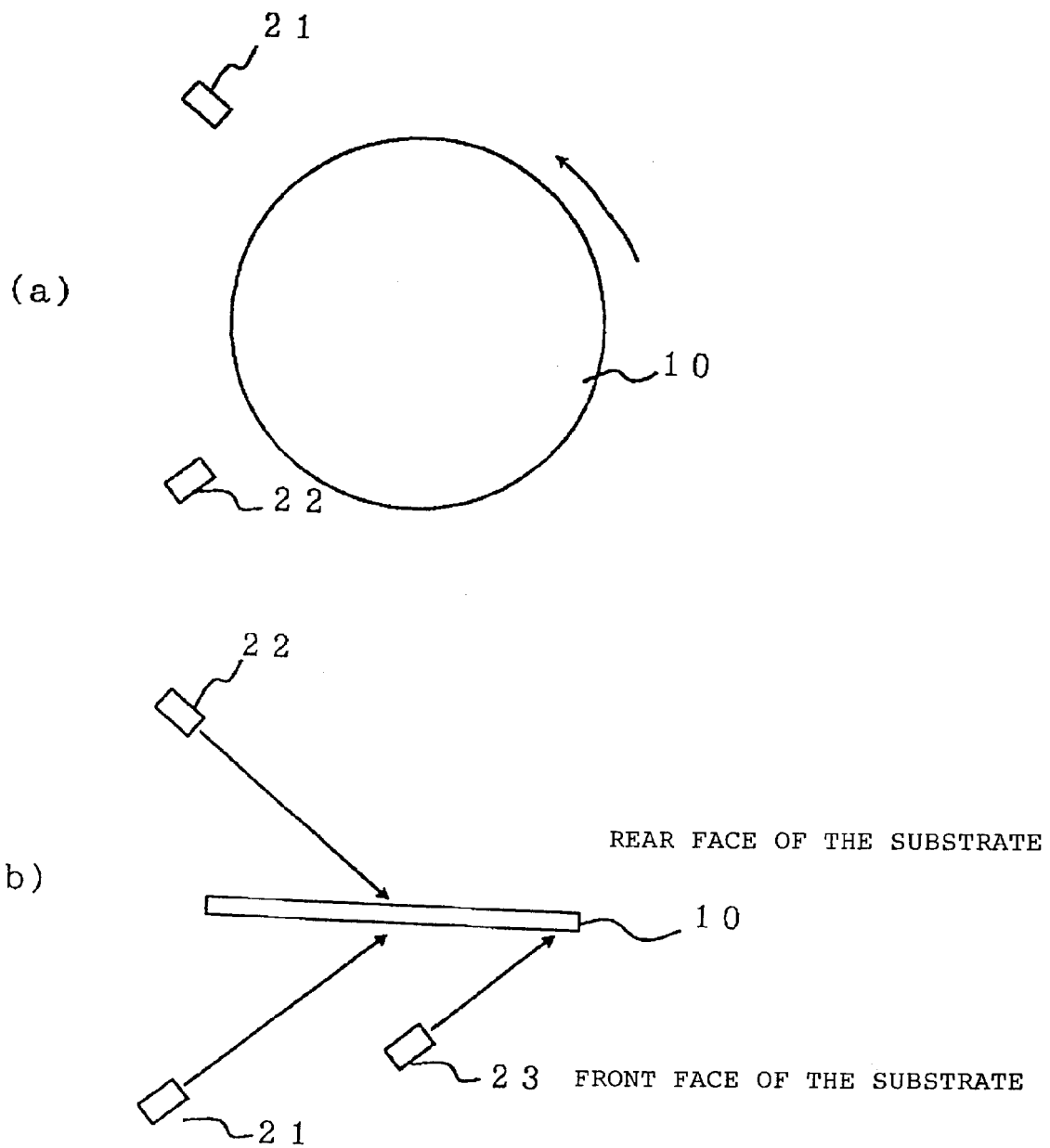
FIG. 6 shows a procedure for removing a ruthenium containing metal using a remover.
Figure 7:
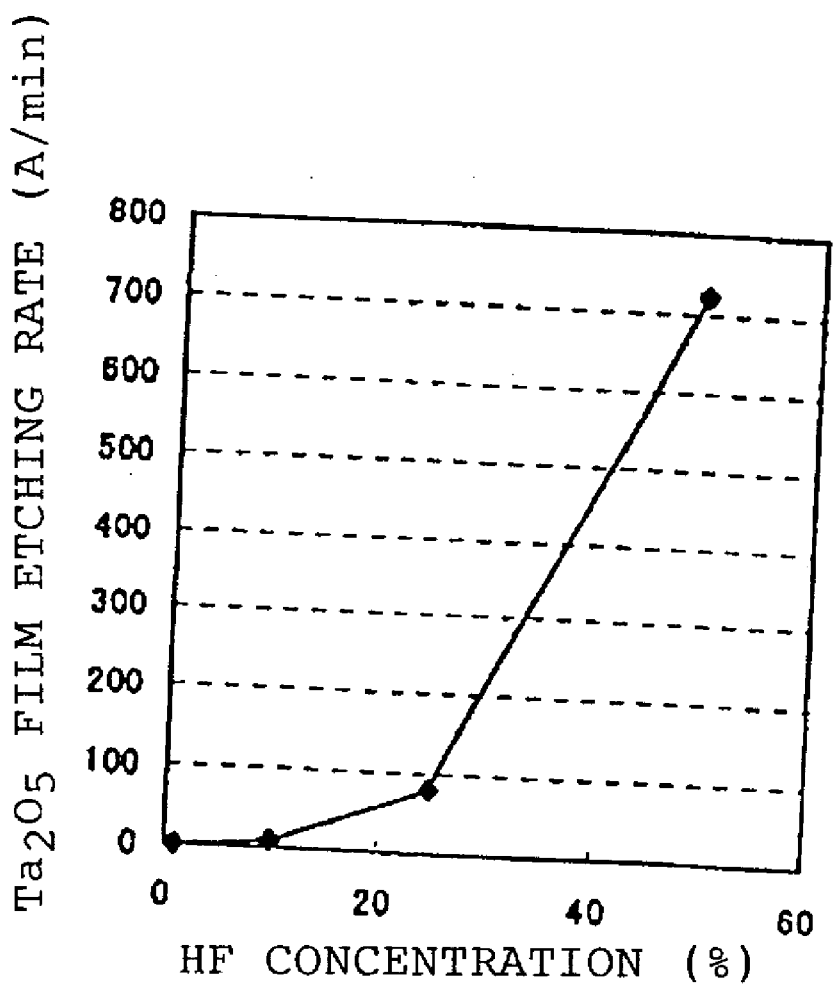
FIG. 7 is a graph showing an etching rate for a tantalum oxide film.
Figure 8:
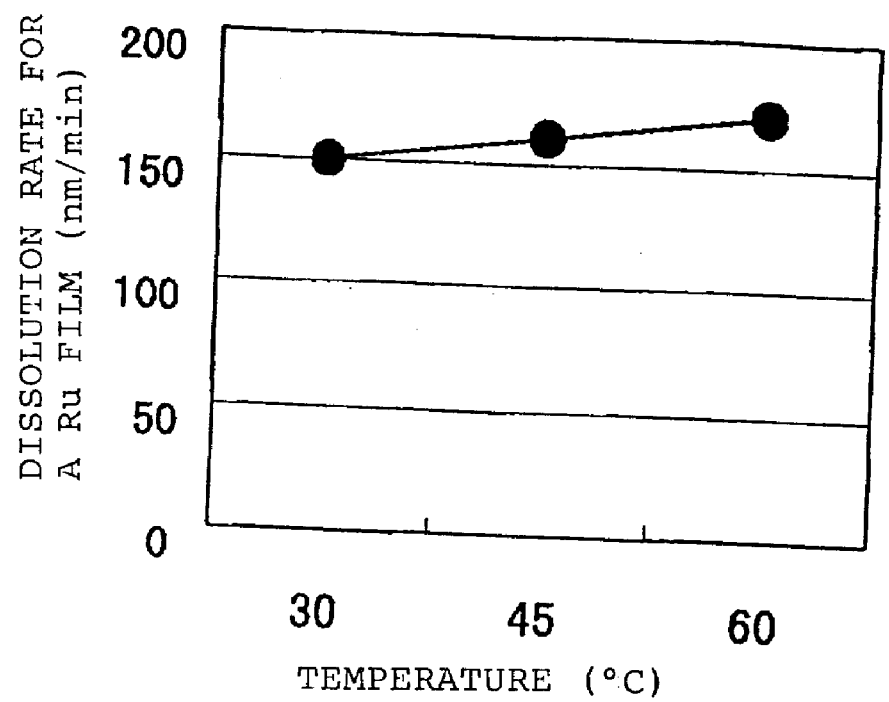
FIG. 8 shows a dissolution rate for ruthenium when a substrate is spin-washed with a remover containing cerium (IV) ammonium nitrate and nitric acid.

FIG. 6 shows another example of spin washing where a liquid is introduced to the surface of the semiconductor substrate 10 (the device forming surface) to prevent the remover from adhering to the device forming area. Rotating the silicon substrate 10, the remover is sprayed from a rear-face nozzle 22 and an end-face nozzle 23 while a liquid is introduced to the front surface from the front-face nozzle 21. It may prevent the remover from going around to the device forming area. The liquid introduced from the front-face nozzle may be one which does not give damage to the device forming area; for example, pure water.

Using the above procedure, a ruthenium containing metal may be removed with a remover.

After treatment with a remover, the residual remover may be optionally removed with a washing. After the above removing procedure, a precipitated cerium (IV) nitrate salt may remain on the semiconductor substrate 10. It may be removed by washing to effectively prevent cross contamination between devices or wafers, leading to improvement in an yield and device reliability. The washing herein may be a liquid containing hydrofluoric acid because it can effectively dissolve and remove a cerium (IV) nitrate salt and can prevent re-adhesion of the removed cerium (IV) nitrate salt.

Then, undesired parts of the contact film and the lower electrode film 6 are removed by etching back or chemical mechanical polishing (CMP). FIG. 4(b) shows the state after removal. As illustrated in this figure, the contact film 5 and the lower electrode film 6 are leveled with the interlayer insulating film 3 to prevent the electrodes of the other adjacent capacitors from being in contact with the lower electrode film 6.

Then, over the whole surface of the substrate are sequentially formed a capacitance insulating film 7 made of $Ta_2O_5$ and an upper electrode film 8 made of ruthenium (FIG. 4(c)).

The capacitance insulating film 7 may be deposited by CVD using pentaethoxytantalum and oxygen as main materials. A dielectric material constituting the capacitance insulating film 7 may be, besides $Ta_2O_5$, a perovskite material such as BST ($Ba_xSr_{1-x}TiO_3$), PZT ($PbZr_xTi_{1-x}O_3$), PLZT ($Pb_{1-y}La_yZr_xTi_{1-x}O_3$) and $SrBi_2Ta_2O_9$. There are no restrictions to a procedure for depositing the capacitance insulating film, and for example CVD, a sol-gel method or sputtering may be used.

After forming the upper electrode film, the ruthenium containing metal is again removed. FIG. 2(a) or (b) shows the state just before the removing procedure, where the capacitance insulating film 7 and the upper electrode film 8 are deposited on the end and the rear faces of the silicon substrate 10. The remover used contains (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid. Component (b) is preferably nitric acid or acetic acid. Such a remover may be used to effectively remove the ruthenium containing metal as described above and to effectively prevent re-adhesion of the removed ruthenium containing metal.

After treatment with the remover, the residual remover may be removed using a washing, which is preferably a liquid containing hydrofluoric acid. An aqueous solution of 20 wt % or more hydrofluoric acid may be used as a washing to simultaneously remove both $Ta_2O_5$ and a ruthenium containing metal adhering the end and the rear faces of the silicon substrate.

Then, the substrate is subject to dry etching to separate the capacitance insulating film 7 and the upper electrode film 8 for each chip. As described above, the capacitor consisting of the contact film 5, the lower electrode film 6, the capacitance insulating film 7 and the upper electrode film 8 is provided.

In this embodiment, treatment with a remover for a ruthenium containing metal is conducted twice, i.e., after forming the lower electrode and after forming the upper electrode. Such a procedure is preferable, but alternatively the ruthenium containing metal may be removed only after forming the upper electrode.

In this embodiment, the residual remover is twice removed by washing, i.e., after removing the ruthenium containing metal after forming the lower electrode and after removing the ruthenium containing metal after forming the upper electrode. Such a procedure is preferable, but alternatively the washing process may be conducted only after forming the upper or the lower electrode.

In this embodiment, both lower electrode film 6 and upper electrode film 8 are made of ruthenium, but only one of these may be made of ruthenium. An electrode other than a ruthenium film may be, for example, a platinum film or a laminated film of iridium and iridium oxide films. A thickness of each film constituting a capacitor is appropriately determined depending on factors such as the diameter of the concave in FIGS. 3 and 4. For example, when the diameter of the concave is about 0.2 μm, the thicknesses of the contact film 5, the lower and the upper electrode films 6, 8 and the capacitance insulating film 7 may be about 5 to 30 nm, about 20 to 50 nm and about 5 to 20 nm, respectively.

There are no restrictions to a type of a capacitor to which this invention may be applied. In the above embodiment, the capacitor is formed in the concave formed in the insulating film on the semiconductor substrate, but alternatively, there may be formed a concave, in which a capacitor may be then formed where the capacitor has a so-called cylindrical shape. Besides these shapes, the capacitor may have a variety of shapes such as planer, stack and fin types.

This invention may be, of course, suitably applied to not only DRAM and FeRAM but also SOCs comprising a logic device together with these.

EXAMPLE 1

A silicon substrate on which ruthenium was deposited to a thickness of 50 nm was cut to give an about 2 cm×2 cm chip as a sample. The sample was immersed in a remover consisting of 30 wt % of cerium (IV) ammonium nitrate, 10 wt % of nitric acid and water as the balance, and was left until the film substantially disappeared. A temperature of the remover was varied in four steps of 30° C., 40° C., 50° C. and 60° C. to determine a dissolution rate for ruthenium at each temperature. The results are shown in Table 1, where a dissolution rate is given in nm/min.

TABLE 1

| Remover temperature (° C.) | Dissolution rate (nm/min) |
|---|---|
| 30 | 2 |
| 40 | 15 |
| 50 | 28 |
| 60 | 61 |

Comparative Example 1

Evaluation was attempted as described in Example 1 using a remover consisting of 10 wt % of cerium (IV) ammonium nitrate and water as the balance, but a sample could not be evaluated due to clouding during preparation of the remover.

Comparative Example 2

Evaluation was attempted as described in Example 1 using a remover consisting of 30 wt % of cerium (IV) ammonium nitrate, 5 wt % of hydrochloric acid and water as the balance, but a sample could not be evaluated due to foaming during preparation of the remover.

Comparative Example 3

Evaluation was attempted as described in Example 1 using a remover consisting of 30 wt % of cerium (IV) ammonium nitrate, 5 wt % of sulfuric acid water as the balance, but a sample could not be evaluated due to precipitation during preparation of the remover.

EXAMPLE 2

On a silicon substrate was deposited ruthenium by CVD to prepare a sample with a film thickness of 50 nm. The sample was subject to spin washing using a remover consisting of 30 wt % of cerium (IV) ammonium nitrate, 5 wt % of nitric acid and water as the balance. A temperature of the remover during washing was varied in four steps of 30° C., 45° C. and 60° C. A time taken until the ruthenium film completely disappeared was determined and from the measured time a dissolution rate was calculated. The results are shown in Table 8. Comparison of the results in Table 8 to those in Table 1 indicate that a dissolving performance of the remover was significantly improved by using spin washing. Furthermore, the remover exhibits adequate removing performance to eliminate the need of an apparatus for heating the remover, resulting in reduction in a manufacturing cost.

In a manufacturing process for a DRAM, a thickness of a ruthenium film is usually 50 nm or less. A ruthenium film on the rear face of the substrate herein also has a thickness of 50 nm or less. A washing time for spin washing is desirably within 60 sec. in the light of process efficiency. Thus, a remover requires performance that it can remove ruthenium with a film thickness of about 50 nm by spin washing within 60 sec in a dissolution rate of 50 nm/min. The results shown in the figure indicate that the remover used in this example has a dissolution rate of 150 nm/min or more at any temperature and has practically adequate removing performance.

EXAMPLE 3

On a silicon substrate surface was deposited ruthenium by CVD to prepare a sample with a film thickness of 50 nm. In association with this deposition, a large amount of a ruthenium containing metal (ruthenium and ruthenium oxide) adhered to the rear face of the substrate, leading to ruthenium contamination.

Effects of a remover was evaluated when applying it to ruthenium contamination. A remover consisted of 30 wt % of cerium (IV) ammonium nitrate, 5 wt % of nitric acid and water as the balance. Spin washing under the following conditions were employed:

Rotating speed: 300 rpm
Washing time: 40 sec.
Remover temperature: 45° C.

The substrate after washing was rinsed with water and dried by nitrogen blow.

Figure 9:
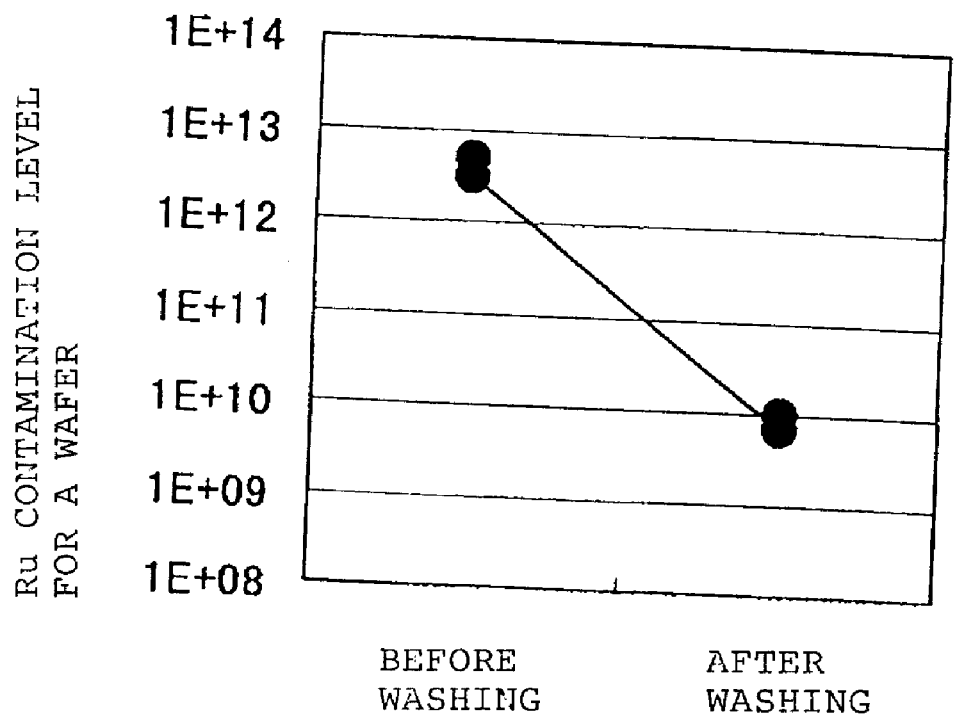
FIG. 9 shows an effect of removing a ruthenium containing metal according to this invention.

A content of the ruthenium containing metal adhering to the rear face of the substrate was determined as follows before and after washing. A sample was analyzed by HF-vapor decomposition-ICP-MS (inductively coupled plasma-mass spectroscopy) to determine the content of the ruthenium containing metal. The results are shown in FIG. 9. As seen the figure, a removing procedure may be conducted by spin washing using a remover with a particular composition to achieve prominent effect of removing the ruthenium containing metal.

EXAMPLE 4

On a silicon substrate is deposited ruthenium by CVD to a thickness of 50 nm, and the substrate was spin-washed with a remover consisting of 30 wt % of cerium (IV) ammonium nitrate, 5 wt % of nitric acid and water as the balance. A substrate temperature was 60° C. and a washing duration was 20 sec. The substrate was rinsed with pure water, spin-dried and determined for the amount of adhering cerium. The measured value was $460 \times 10^{10}$ atoms/cm$^2$.

The substrate was subject to spin washing using washings in Table 2. The content of each component is given as a wt % to the whole washing. A washing duration was 20 sec. Then, the substrate was rinsed with pure water, dried and then determined for the amount of adhering cerium. The results are shown in Table 2. The amount of adhering cerium was measured by ICP-MS as described in Example 3.

TABLE 2

|  |  | No. 1 | No. 2 |
|---|---|---|---|
| Washing | Hydrofluoric acid | 49 |  |
|  | Nitric acid |  | 35 |
|  | Water | Balance | Balance |
| Residual cerium ($\times 10^{10}$ atoms/cm$^2$) (0091) |  | 0.36 | 2.5 |

EXAMPLE 5

There will be described an example where this invention is applied to a process for forming a capacitor.

As shown in FIG. 3(a), on a silicon substrate 1 is formed an MOS transistor comprising a source-drain diffusion region (not shown). Then, an interlayer insulating film 2 made of silicon oxide was deposited over the whole surface of the silicon substrate 1. Then, a contact plug 4 was formed in the unshown diffusion region. It was dry-etched to form a hole with an oval cross section reaching the contact plug 4, whose dimensions were 0.2 μm×0.4 μm i.d. (FIG. 3(b)). Then, over the whole surface of the substrate were sequentially deposited Ti and TiN to form a contact film 5 to the total film thickness of 10 nm (FIG. 3(c)).

Over the whole surface of the substrate was formed a lower electrode film 6 to a thickness of 30 nm (FIG. 4(a)) by CVD using bis-(ethylcyclopentadienyl)ruthenium as a material gas.

For removing a ruthenium containing metal adhering to an area other than a device forming area in the silicon substrate, the substrate was treated with a remover, whose composition is as follows:

Cerium (IV) ammonium nitrate: 30 wt %
Nitric acid: 5 wt %
Water: balance.

The ruthenium containing metal was removed by spin washing. Specifically, nitrogen gas was introduced to the surface (the device forming surface) of the rotating substrate while adding dropwise the remover on the rear face, where a remover temperature was 30° C. and a washing duration was 40 sec.

After removal, the substrate was rinsed with pure water and then the residual remover was removed by spin washing using an aqueous solution of 40% hydrofluoric acid. A washing duration was 20 sec. and a washing temperature was room temperature (about 25° C.).

Then, over the whole surface were sequentially formed a capacitance insulating film 7 made of Ta$_2$O$_5$ to a thickness of 10 nm and an upper electrode film 8 made of ruthenium to a thickness of 30 nm (FIG. 4(c)). Deposition of the capacitance insulating film 7 was conducted by CVD using pentaethoxytantalum and oxygen as main materials. Then, the substrate was dry-etched and the capacitance insulating film 7 and the upper electrode film 8 were separated for each chip unit.

Then, the substrate was again treated with a remover for removing the ruthenium containing metal adhering an area other than the device forming area on the silicon substrate. The remover was that described above. Then, the substrate was spin-washed using an aqueous solution of 40% hydrofluoric acid as described above at room temperature (about 25° C.) for 20 sec. This treatment can simultaneously remove $Ta_2O_5$ and ruthenium adhering on the end and the rear faces of the silicon substrate.

Thus, there was provided a capacitor consisting of the contact film 5, the lower electrode film 6, the capacitance insulating film 7 and the upper electrode film 8 (FIG. 4(c)).

The manufacturing process for a semiconductor device described above showed an improved yield and improved properties of the semiconductor device provided.

EXAMPLE 6

A semiconductor device was prepared as described in Example 5, except that a residual washing was washed out only once after removing a ruthenium containing metal subsequent to forming an upper electrode.

The manufacturing process for a semiconductor device in this example showed an improved yield and improved properties of the semiconductor device provided.

As described above, according to a process for manufacturing a semiconductor device of this invention, a substrate can be treated with a remover containing a cerium (IV) nitrate salt to adequately dissolve and remove a ruthenium containing metal and to effectively prevent re-adhesion of the removed ruthenium containing metal. Thus, this invention may be suitably applied to a process such as that for a DRAM where strict requirements must be met for preventing contamination.

Furthermore, a substrate may be washed with, for example, a solution containing hydrofluoric acid after treatment with a remover in this invention, to effectively prevent the remover from remaining and achieve a higher level of contamination prevention.

This application is based on Japanese patent application NO.2000-47443 filed on Feb. 24, 2000, the content of which is incorporated hereinto by reference.

What is claimed is:

1. A process for manufacturing a semiconductor device, comprising the steps of:
    depositing an insulating film in a device forming area on a semiconductor device;
    depositing a barrier metal film on the insulating film;
    depositing a first ruthenium film on the barrier metal film;
    removing undesired ruthenium containing metal resulting from the deposit of said first ruthenium film adhering to an area other than the device forming area using a first remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid, but excluding the combination of acetic acid and salts containing tetravalent cerium ion;
    removing the residual first remover using a first washing,
    sequentially depositing a capacitance insulating film and a second ruthenium film after patterning the first ruthenium film,
    removing undesired ruthenium containing metal resulting from the deposit of said second ruthenium film adhering to an area other than the device forming area using a second remover containing (a) at least one compound selected from the group consisting of salts containing chlorate, percholate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid, but excluding the combination of acetic acid and salts containing tetravalent cerium ion; and
    removing the residual second remover using a second washing.

2. The process for manufacturing a semiconductor device as claimed in claim 1 wherein the first washing is a liquid containing hydrofluoric acid.

3. The process for manufacturing a semiconductor device as claimed in claim 1 wherein the ruthenium containing metal resulting from depositing said first ruthenium film is removed using the first remover by spraying the first remover on a given area on the semiconductor substrate while rotating the substantially horizontal semiconductor substrate.

4. The process for manufacturing a semiconductor device as claimed in claim 3 wherein a gas or liquid is sprayed on the surface having the device forming area on the semiconductor device during removing the ruthenium containing metal resulting from depositing said first ruthenium film with the first remover.

5. The process for manufacturing a semiconductor device as claimed in claim 1 wherein water is sprayed on the surface having the device forming area on the semiconductor device for washing after removing the ruthenium containing metal resulting from the deposit of said first ruthenium film with the first remover.

6. The process for manufacturing a semiconductor device as claimed in claim 1 wherein the semiconductor substrate is subjected to brush scrub washing after depositing the first ruthenium film and before removing the undesired ruthenium containing metal resulting from the deposit of said first ruthenium film.

7. The process for manufacturing a semiconductor device as claimed in claim 6 wherein the brush scrub washing is conducted using water, aqueous ammonia, electrolytic cathode water or hydrogen-dissolving water.

8. The process for manufacturing a semiconductor device as claimed in claim 1 wherein the undesired ruthenium containing metal resulting from the deposit of said second ruthenium film is removed using the second remover by spraying the second remover on a given area on the semiconductor substrate while rotating the substantially horizontal semiconductor substrate.

9. The process for manufacturing a semiconductor device claimed in claim 8 wherein a gas or liquid is sprayed on the surface having the device forming area on the semiconductor device forming area on the semiconductor device during removing the undesired ruthenium containing metal resulting from the deposit of said second ruthenium film with the second remover.

10. The process for manufacturing a semiconductor device as claimed in claim 1 wherein water is sprayed on the surface having the device forming area on the semiconductor device for washing after removing the undesired ruthenium containing metal resulting from the deposit of said second ruthenium film with the second remover and before removing the residual second remover using the second washing.

11. The process for manufacturing a semiconductor device as claimed in claim 1 wherein the semiconductor substrate is subjected to brush scrub washing after depositing the second ruthenium film and before removing the undesired ruthenium containing metal resulting from the deposit of said second ruthenium film.

12. The process for manufacturing a semiconductor device as claimed in claim 11 wherein the brush scrub washing is conducted using water or aqueous ammonia.

13. The process for manufacturing a semiconductor device as claimed in claim 1 wherein the second washing is a liquid containing hydrofluoric acid.

14. The process for manufacturing a semiconductor device as claimed in claim 13 wherein the second washing is an aqueous solution contains 20 wt % or more of hydrofluoric acid.

15. The process for manufacturing a semiconductor device as claimed in claim 1 wherein the first and the second ruthenium films are deposited by CVD.

16. The process for manufacturing a semiconductor device as claimed in claim 1 wherein component (b) is nitric acid or acetic acid.

17. A process for manufacturing a semiconductor device, comprising the steps of:
  depositing an insulating film in a device forming area on a semiconductor substrate,
  depositing a barrier metal film on the insulating film;
  depositing a first ruthenium film on the barrier metal film;
  removing undesired ruthenium containing metal resulting from the deposit of said first ruthenium film adhering to an area other than the device forming area using a first remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid, but excluding the combination of acetic acid and salts containing tetravalent cerium ion;
  sequentially depositing a capacitance insulating film and a second ruthenium film after patterning the first ruthenium film,
  removing undesired ruthenium containing metal resulting from the deposit of said second ruthenium film adhering to an area other than the device forming area using a second remover containing (a) at least one compound selected from the group consisting of salts containing chlorate, percholate, iodate, periodate, salts containing bromine oxide ion, and salts containing manganese oxide ion and salts containing tetravalent cerium ion and (b) at least one acid selected from the group consisting of nitric acid, acetic acid, iodic acid and chloric acid, but excluding the combination of acetic acid and salts containing tetravalent cerium; and
  removing the residual second remover using a second washing.

18. The process for manufacturing a semiconductor device as claimed in claim 17 wherein the ruthenium containing metal resulting from the deposit of said first ruthenium film is removed using the first remover by spraying the first remover on a given area on the semiconductor substrate while rotating the substantially horizontal semiconductor substrate.

19. The process for manufacturing a semiconductor device as claimed in claim 18 wherein a gas or liquid is sprayed on the surface having the device forming area on the semiconductor device during removing the ruthenium containing metal resulting from depositing said first ruthenium film with the first remover.

20. The process for manufacturing a semiconductor device as claimed in claim 17 wherein water is sprayed on the surface having the device forming area on the semiconductor device for washing after removing the ruthenium containing metal resulting from the deposit of said first ruthenium film with the first remover.

21. The process for manufacturing a semiconductor device as claimed in claim 17 wherein the semiconductor substrate is subjected to brush scrub washing after depositing the first ruthenium film and before removing the undesired ruthenium containing metal resulting from the deposit of said first ruthenium film.

22. The process for manufacturing a semiconductor device as claimed in claim 21 wherein the brush scrub washing is conducted using water, aqueous ammonia, electrolytic cathode water or hydrogen-dissolving water.

23. The process for manufacturing a semiconductor device as claimed in claim 17 wherein the undesired ruthenium containing metal resulting from the deposit of said second ruthenium film is removed using the second remover by spraying the second remover on a given area on the semiconductor substrate while rotating the substantially horizontal semiconductor substrate.

24. The process for manufacturing a semiconductor device claimed in claim 23 wherein a gas or liquid is sprayed on the surface having the device forming area on the semiconductor device forming area on the semiconductor device during removing the undesired ruthenium containing metal resulting from the deposit of said second ruthenium film with the second remover.

25. The process for manufacturing a semiconductor device as claimed in claim 17 wherein water is sprayed on the surface having the device forming area on the semiconductor device for washing after removing the undesired ruthenium containing metal resulting from the deposit of said second ruthenium film with the second remover and before removing the residual second remover using the second washing.

26. The process for manufacturing a semiconductor device as claimed in claim 17 wherein the semiconductor substrate is subjected to brush scrub washing after depositing the second ruthenium film and before removing the undesired ruthenium containing metal resulting from the deposit of said second ruthenium film.

27. The process for manufacturing a semiconductor device as claimed in claim 26 wherein the brush scrub washing is conducted using water or aqueous ammonia.

28. The process for manufacturing a semiconductor device as claimed in claim 17 wherein the second washing is a liquid containing hydrofluoric acid.

29. The process for manufacturing a semiconductor device as claimed in claim 28 wherein the second washing is an aqueous solution contains 20 wt % or more of hydrofluoric acid.

30. The process for manufacturing a semiconductor device as claimed in claim 17 wherein the first and the second ruthenium films are deposited by CVD.

31. The process for manufacturing a semiconductor device as claimed in claim 17 wherein component (b) is nitric acid or acetic acid.

32. A process for manufacturing a semiconductor device, comprising the steps of:

depositing an insulating film in a device forming area on a semiconductor substrate, depositing a barrier metal film on the insulating film;

depositing a first ruthenium film on the barrier metal film;

sequentially depositing a capacitance insulating film and a second ruthenium film after patterning the first ruthenium film, removing a ruthenium containing metal adhering to an area other than the device forming area using a remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid, but excluding the combination of acetic acid and salts containing tetravalent cerium ion; and removing the residual remover using a washing.

33. The process for manufacturing a semiconductor device as claimed in claim 32 wherein the ruthenium containing metal is removed using the remover by spraying the remover on a given area on the semiconductor substrate while rotating the substantially horizontal semiconductor substrate.

34. The process for manufacturing a semiconductor device as claimed in claim 33 wherein a gas or liquid is sprayed on the surface having the device forming area on the semiconductor device during removing the ruthenium containing metal with the remover.

35. The process for manufacturing a semiconductor device as claimed in claim 32 wherein water is sprayed on the surface having the device forming area on the semiconductor device for washing after removing the ruthenium containing metal with the remover.

36. The process for manufacturing a semiconductor device as claimed in claim 32 wherein the semiconductor substrate is subjected to brush scrub washing after depositing the first ruthenium film and before removing the undesired ruthenium containing metal.

37. The process for manufacturing a semiconductor device as claimed in claim 36 wherein the brush scrub washing is conducted using water, aqueous ammonia, electrolytic cathode water or hydrogen-dissolving water.

38. The process for manufacturing a semiconductor device as claimed in claim 32 wherein the ruthenium containing metal is removed using the remover by spraying the remover on a given area on the semiconductor substrate while rotating the substantially horizontal semiconductor substrate.

39. The process for manufacturing a semiconductor device claimed in claim 38 wherein a gas or liquid is sprayed on the surface having the device forming area on the semiconductor device forming area on the semiconductor device during removing the undesired ruthenium containing metal with the remover.

40. The process for manufacturing a semiconductor device as claimed in claim 32 wherein water is sprayed on the surface having the device forming area on the semiconductor device for washing after removing the undesired ruthenium containing metal with the remover and before removing the residual remover using the washing.

41. The process for manufacturing a semiconductor device as claimed in claim 32 wherein the semiconductor substrate is subjected to brush scrub washing after depositing the second ruthenium film and before removing the undesired ruthenium containing metal.

42. The process for manufacturing a semiconductor device as claimed in claim 41 wherein the brush scrub washing is conducted using water or aqueous ammonia.

43. The process for manufacturing a semiconductor device as claimed in claim 32 wherein the washing is a liquid containing hydrofluoric acid.

44. The process for manufacturing a semiconductor device as claimed in claim 43 wherein the washing is an aqueous solution contains 20 wt % or more of hydrofluoric acid.

45. The process for manufacturing a semiconductor device as claimed in claim 32 wherein the first and the second ruthenium films are deposited by CVD.

46. The process for manufacturing a semiconductor device as claimed in claim 32 wherein component (b) is nitric acid or acetic acid.

47. A process for manufacturing a semiconductor device comprising the step of sequentially forming a lower electrode film, a capacitance insulating film and an upper electrode film in a device forming area on a semiconductor substrate, wherein the lower and/or the upper electrode films are made of ruthenium and comprising the steps of after deposing the ruthenium films, removing a ruthenium containing metal adhering to an area other than the device forming area using a remover containing (a) at least one compound selected from the group consisting of salts containing chlorate, perchlorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid, but excluding the combination of acetic acid and salts containing tetravalent cerium ion; and then removing the residual remover using a washing.

48. The process for manufacturing a semiconductor device as claimed in claim 47 wherein the washing is a liquid containing hydrofluoric acid.

49. The process for manufacturing a semiconductor device as claimed in claim 48 wherein the washing is an aqueous solution contains 20 wt % or more of hydrofluoric acid.

50. The process for manufacturing a semiconductor device as claimed in claim 47 wherein component (b) is nitric acid or acetic acid.

51. The process for manufacturing a semiconductor device as claimed in claim 47 wherein the ruthenium films are deposited by CVD.

52. A process for manufacturing a semiconductor device comprising the steps of:

depositing a ruthenium film in a device forming area on a semiconductor substrate, and spraying on a given area on the semiconductor substrate a remover containing (a) at least one compound selected from the group consisting of salts containing chlorate, perchorate, iodate, periodate, salts containing bromine oxide ion, salts containing manganese oxide ion and salts containing tetravalent cerium ion and (b) at least one acid selected from the group consisting of nitric acid, acetic acid, iodic acid and chloric acid, but excluding the combination of salts containing tetravalent cerium ion and acetic acid, while rotating the substantially horizontal semiconductor substrate to remove a ruthenium containing metal adhering to an area other than the device forming area.

53. The process for manufacturing a semiconductor device as claimed in claim 52 wherein the residual remover is removed with a washing after removing the ruthenium containing metal with the remover.

54. The process for manufacturing a semiconductor device as claimed in claim 53 wherein the washing is a liquid containing hydrofluoric acid.

55. The process for manufacturing a semiconductor device as claimed in claim 54 wherein the washing is an aqueous solution contains 20 wt % or more of hydrofluoric acid.

56. The process for manufacturing a semiconductor device as claimed in claim 52 wherein component (b) is nitric acid or acetic acid.

57. The process for manufacturing a semiconductor device as claimed in claim 52 wherein the ruthenium film is deposited by CVD.

* * * * *